United States Patent
Tsukigata et al.

(10) Patent No.: US 11,101,391 B2
(45) Date of Patent: Aug. 24, 2021

(54) SCREEN PRINTING APPARATUS, SCREEN PRINTING METHOD, AND ELECTRODE FORMATION METHOD OF SOLAR BATTERY

(71) Applicant: SHIN-ETSU CHEMICAL CO., LTD., Tokyo (JP)

(72) Inventors: Shintarou Tsukigata, Takasaki (JP); Norifumi Takahashi, Kamisu (JP); Hiroyuki Otsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 615 days.

(21) Appl. No.: 15/745,650

(22) PCT Filed: Jul. 15, 2016

(86) PCT No.: PCT/JP2016/003347
§ 371 (c)(1),
(2) Date: Jan. 17, 2018

(87) PCT Pub. No.: WO2017/013866
PCT Pub. Date: Jan. 26, 2017

(65) Prior Publication Data
US 2018/0219111 A1  Aug. 2, 2018

(30) Foreign Application Priority Data
Jul. 22, 2015  (JP) .............................. JP2015-145152

(51) Int. Cl.
*H01L 31/0224* (2006.01)
*H01L 31/18* (2006.01)
(Continued)

(52) U.S. Cl.
CPC .. *H01L 31/022425* (2013.01); *B41F 15/0881* (2013.01); *B41F 15/12* (2013.01);
(Continued)

(58) Field of Classification Search
CPC ...... B41F 15/42; B41F 15/0881; B41F 15/08; B41F 15/12; B41F 15/36; B41M 1/12;
(Continued)

(56) References Cited

U.S. PATENT DOCUMENTS

2002/0040758 A1   4/2002  Yamane et al.
2007/0228336 A1  10/2007  Uchimi et al.
(Continued)

FOREIGN PATENT DOCUMENTS

CN       1247016 A    3/2000
CN     101047049 A   10/2007
(Continued)

OTHER PUBLICATIONS

Feb. 1, 2018 International Preliminary Report on Patentability issued in International Patent Application No. PCT/JP2016/003347.
(Continued)

*Primary Examiner* — Angel Roman
(74) *Attorney, Agent, or Firm* — Oliff PLC

(57) ABSTRACT

A method for screen printing, including: by using a screen printing apparatus provided with a screen printing plate having an opening part corresponding to a printing pattern, a scraper, and a squeegee, filling a paste supplied on an upper surface of the screen printing plate into the opening part of the screen printing plate by the scraper; and, after that, pushing out the paste to a predetermined position of an object to be printed from the opening part of the screen printing plate by the squeegee to screen-print the paste corresponding to the printing pattern on the object to be printed, wherein the humidity in the screen printing appa-
(Continued)

ratus is adjusted during the screen printing. As a result, by controlling an amount of moisture in the paste on the screen printing plate, a screen printing method is capable of improving the printing property of the paste.

15 Claims, 12 Drawing Sheets

(51) Int. Cl.
*B41M 1/12* (2006.01)
*B41M 1/34* (2006.01)
*B41M 3/00* (2006.01)
*B41F 15/12* (2006.01)
*B41F 15/08* (2006.01)
*H05K 3/12* (2006.01)

(52) U.S. Cl.
CPC ............... *B41M 1/12* (2013.01); *B41M 1/34* (2013.01); *B41M 3/006* (2013.01); *H01L 31/0224* (2013.01); *H01L 31/18* (2013.01); *H05K 3/1233* (2013.01); *B41P 2200/40* (2013.01); *B41P 2215/50* (2013.01)

(58) Field of Classification Search
CPC ............... B41M 1/34; H01L 31/0224; H01L 31/022425
See application file for complete search history.

(56) References Cited

U.S. PATENT DOCUMENTS

| | | | |
|---|---|---|---|
| 2008/0196608 A1 | 8/2008 | Ojima et al. | |
| 2009/0314336 A1 | 12/2009 | Nakatani et al. | |
| 2011/0045624 A1* | 2/2011 | Tsukigata | H01L 21/2254 438/57 |

FOREIGN PATENT DOCUMENTS

| | | |
|---|---|---|
| CN | 101203384 A | 6/2008 |
| JP | H01-184994 A | 7/1989 |
| JP | H04-236494 A | 8/1992 |
| JP | H07-125175 A | 5/1995 |
| JP | 2006-286366 A | 10/2006 |
| JP | 2006-347077 A | 12/2006 |
| JP | 2007-273271 A | 10/2007 |
| JP | 2011-212926 A | 10/2011 |
| JP | 2012-054112 A | 3/2012 |
| JP | 2013-143457 A | 7/2013 |
| JP | 2013-146958 A | 8/2013 |
| WO | 2011/111192 A1 | 9/2011 |

OTHER PUBLICATIONS

Sep. 18, 2018 Office Action issued in Japanese Patent Application No. 2017-529453.
Apr. 14, 2020 Office Action issued in Japanese Patent Application No. 2019-138152.
Sep. 20, 2016 Search Report issued in International Patent Application No. PCT/JP2016/003347.
Feb. 3, 2019 Office Action issued in Chinese Patent Application No. 201680042453.8.
May 7, 2019 Office Action issued in Japanese Patent Application No. 2017-529453.
Sep. 23, 2019 Office Action issued in Chinese Patent Application No. 201680042453.8.
Nov. 17, 2020 Decision of Refusal issued in Japanese Patent Application No. 2019-138152.
Nov. 17, 2020 Decision to Dismiss the Amendment issued in Japanese Patent Application No. 2019-138152.
Oct. 29, 2020 Examination Report issued in Indian Patent Application No. 201847002218.

* cited by examiner (a)

(b)

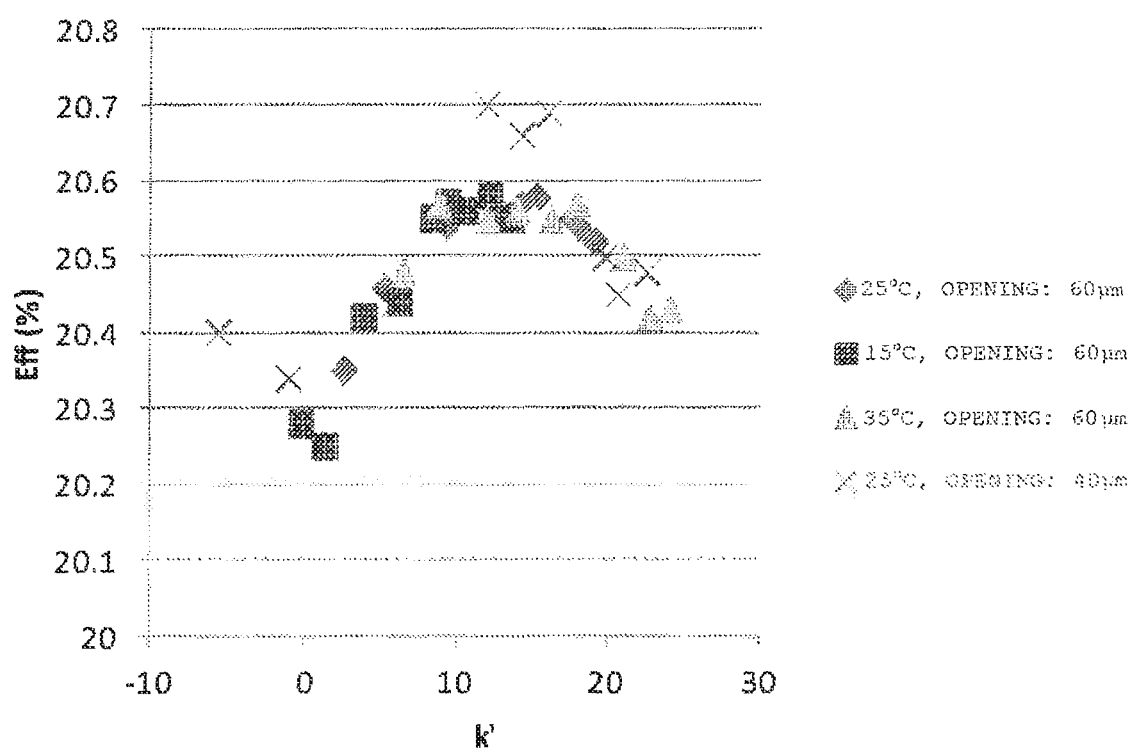

SCREEN PRINTING APPARATUS, SCREEN PRINTING METHOD, AND ELECTRODE FORMATION METHOD OF SOLAR BATTERY

TECHNICAL FIELD

The present invention relates to a screen printing apparatus, a screen printing method, and an electrode formation method for a solar battery.

BACKGROUND ART

In general, a solar battery has a structure shown in FIG. 7. As shown in FIG. 7, in a solar battery 50, for an n-type semiconductor substrate 51 that has a plate shape having, for example, a magnitude of from 100 to 156 mm square and a thickness of from 0.1 to 0.3 mm, is made of polycrystalline or single crystal silicon and is doped with an n-type impurity such as phosphorus or the like, a p-type diffusion layer 52 is provided on a light-receiving surface side and an n-type diffusion layer 53 is provided on a back surface side. On the p-type diffusion layer 52, a light-receiving surface electrode 55 is provided, and on the n-type diffusion layer 53, a back surface electrode 56 is provided. Further, an antireflection film/passivation film 57 such as SiN (silicon nitride) or the like is provided on the light-receiving surface side. Further, also on the back surface side, a passivation film 58 such as SiN or the like may be provided. Here, the p-type diffusion layer 52 is formed on the light-receiving surface side by doping the p-type impurity such as boron or the like, and the n-type diffusion layer 53 is formed on the back surface side by doping the n-type impurity such as phosphorus or the like. The light-receiving surface electrode 55 and the back surface electrode 56 are formed in such a manner that by using a screen printing method, a conductive silver paste is printed on the back surface side and the light-receiving surface side, followed by drying and firing. These electrodes include bus bar electrodes for taking outside a photo-generated current generated by the solar battery, and a current-collecting finger electrode connected to these bus bar electrodes.

In the solar battery having the structure like this, as described above, the screen printing method is generally used to form an electrode (see, for example, Patent Documents 1 and 2). The screen printing method is suitable for mass-producing thick film electrodes at a high yield, and is advantageous in a point that a cost of equipment is relatively small compared with a photolithography method that handles a photo-sensitive material. Therefore, the screen printing method is extensively used in an electronics industry including, other than an electrode formation for solar batteries, formation of electrode layers, resistive layers or dielectric layers of large area displays such as plasma display panels and liquid crystal display panels, or patterns for fluorescent material layers.

A conventional screen printing method will be described with reference to drawings. FIG. 8 shows a side surface schematic diagram of a main part of a general screen printing apparatus. FIG. 9 shows a plan schematic diagram when a breadth of a paste by a general screen printing method is seen from upper side of a screen printing plate and a side surface schematic diagram when a breadth of a paste by a general screen printing method is seen from a lateral side of a screen printing plate. A series of printing operations will be described with reference to FIG. 8. First, in a screen printing apparatus 110, a paste 116 is provided on a screen printing plate 111 in which a pattern that is wanted to be formed is opened. When a scraper 112 moves on the paste 116 in a definite direction under pressure from an upper portion, the paste 116 is filled in the pattern of the opening part of the screen printing plate 111. Next, when a squeegee 113 moves in a direction opposite to the direction in which the scraper 112 moves under pressure from an upper portion, the paste 116 filled in the pattern of the opening part of the screen printing plate 111 is transferred on an object to be printed 115 placed on a printing stage 114. Subsequently, the scraper 112, while moving in a direction opposite to the direction in which the squeegee 113 moves, fills again the remained paste 116 in the pattern of the opening part of the screen printing plate 111. A series of these operations are repeated.

With reference to FIG. 9, the breadth of the paste in the conventional screen printing method will be described. When continuously repeating the printing operations by the conventional screen printing method, a part of the paste 116 on the screen printing plate 111 is pushed by the squeegee 113 and the scraper 112 and a range of a paste deposition region expands exceeding the range of a printing pattern region 119. Thus, the paste stuck out from a squeegee scanning region and a scraper scanning region is outside of the operation range of the squeegee 113 and the scraper 112, and is not used in the following printings. It is to be noted that, in FIG. 9, a paste deposition region 120 outside of the printing pattern region during continuous printing is schematically shown.

As was described above, in the conventional screen printing method, a part of a supplied paste remains stuck out on both sides of the squeegee operation region after the squeegee operation, as the times of the printing are repeated, a solvent component vaporizes from a stuck out paste surface and the paste surface partially coagulates. When an operator gathers the coagulated paste to a center part by scraping and uses again to print, a viscosity of the paste on the plate locally becomes higher. Accordingly, when the paste is printed in a finger-electrode pattern on the semiconductor substrate to form, in particular, a finger electrode in the solar battery, there is fear that thickening or rubbing of the printed paste may occur. In this case, there is a fear that, in an obtained solar battery, the thickening of the finger electrode may occur, or a yield in an appearance inspection may be deteriorated. These printing failures have a large influence in particular when a width of the finger electrode is not larger than 60 μm, and become a large factor that deteriorates solar battery characteristics.

CITATION LIST

Patent Literatures

Patent Document 1: Japanese Unexamined Patent publication (Kokai) No. 2006-347077 A Patent Document 2: Japanese Unexamined Patent publication (Kokai) No. 2012-054442 A

SUMMARY OF INVENTION

Technical Problem

The present invention was performed in view of the above problems and it is an object of the present invention to provide a screen printing apparatus and a screen printing method, which are capable of improving a printing property of a paste by suppressing solvent volatilization from the paste on a screen printing plate. And it is also an object of the present invention to provide an electrode formation method of a solar battery capable of preparing a solar battery having high electric characteristics by using the screen printing method like this.

Solution to Problem

In order to achieve the above object, the present invention provides a method for screen printing, including:
by using a screen printing apparatus provided with a screen printing plate having an opening part corresponding to a printing pattern, a scraper, and a squeegee, filling a paste supplied on an upper surface of the screen printing plate in the opening part of the screen printing plate by the scraper; and, after that, pushing out the paste to a predetermined position of an object to be printed from the opening part of the screen printing plate by the squeegee to screen-print the paste corresponding to the printing pattern on the object to be printed, wherein the humidity in the screen printing apparatus is adjusted during the screen printing.

According to the screen printing method like this, by controlling an amount of moisture in the paste on the screen printing plate, the printing performance of the paste can be improved.

Further, it is preferable that when performing screen printing, by adjusting the humidity in the screen printing apparatus, a dew-point temperature in the screen printing apparatus is set to 8.2 to 18.0° C.

According to the screen printing method like this, by controlling the amount of moisture in the paste on the screen printing plate, the printing property of the paste may be further improved.

When a temperature in the printing apparatus of the screen printing apparatus is expressed with T (° C.) and a relative humidity in the screen printing apparatus is expressed with H (%), k defined by the following formula is preferably set to be 8.2<k<18.0.

$$k = \frac{35.6HT - 179(69 - T)(1 - H/100)}{35.6H + 49(69 - T)(1 - H/100)} \quad \text{(Formula 1)}$$

Under this condition, cells having a high conversion efficiency can be produced at a high yield.

Further, the humidity in the screen printing apparatus is preferably controlled between 30 to 65% by the relative humidity, and further preferably controlled within 50±5%.

According to the screen printing method like this, an aspect ratio of a printed paste may be enhanced.

The paste preferably contains one or more kinds of organic solvents selected from a aliphatic hydrocarbon-based solvent, a carbitol-based solvent, a cellosolve-based solvent, a higher fatty acid ester-based solvent, a higher alcohol-based solvent, a higher fatty acid-based solvent and an aromatic hydrocarbon-based solvent.

By these, an effect of the present invention can be particularly effectively developed.

A shape of the opening part of the screen printing plate can be formed into a thin line shape, and a length in the longitudinal direction can be formed into from 156 to 8 mm.

The inventive screen printing method is particularly effective for the thin line having a length in the longitudinal direction of the opening part of from 156 to 8 mm.

Further, a width of the opening part of the screen printing plate may be set to not larger than 60 μm.

According to the inventive screen printing method, even when the screen printing plate having a small width of the opening part like this is used, the printing failure becomes difficult to occur.

When the temperature in the printing apparatus of the screen printing apparatus is expressed with T (° C.), the relative humidity in the printing apparatus is expressed with H (%), and the width of the printed matter is expressed with w (μm), k' defined by the following formula is preferably set to be 8.2<k'<18.0.

$$k' = \frac{6.27}{1.0266^w} \left( \frac{35.6HT - 179(69 - T)(1 - H/100)}{35.6H + 49(69 - T)(1 - H/100)} - 14.2 \right) + 14.2 \quad \text{(Formula 2)}$$

Under this condition, for any line widths, cells having a high conversion efficiency can be produced at a high yield.

Further, the present invention provides an electrode formation method of a solar battery including: screen-printing the paste on at least one main surface of a semiconductor substrate by using the inventive screen printing method; and drying and firing the screen-printed paste to form an electrode.

According the electrode formation method of a solar battery like this, an electrode having a high aspect ratio can be easily formed. Accordingly, when the electrode formation method of a solar battery like this is used, a solar battery having high electric characteristics can be prepared.

Further, the electrode to be formed is formed into a finger electrode, the aspect ratio of the finger electrode can be set to 0.5 or more and 1.0 or less.

According to the electrode formation method of a solar battery like this, the finger electrode having the high aspect ratio like this may be readily formed.

Further, according to the present invention, a screen printing apparatus including: a screen printing plate on which an opening part corresponding to a printing pattern is provided; a scraper for filling a paste supplied on an upper surface of the screen printing plate into an opening part of the screen printing plate; a squeegee for pushing out the paste from the opening part of the screen printing plate to a predetermined position of an object to be printed; and a humidity adjuster for adjusting the humidity in a screen printing apparatus is provided.

According to the screen printing apparatus like this, by controlling an amount of moisture in the paste on the screen printing plate, the printing property of the paste can be improved.

It is preferable that a space containing at least the screen printing plate, the scraper, and the squeegee is surrounded by a plate-like member.

Further, a material of the plate-like member is preferably any one of polyethylene, polypropylene, a vinyl chloride resin, polystyrene, an ABS (acrylonitrile/butadiene/styrene) resin, polyethylene terephthalate, a methacrylic resin, polyvinyl alcohol, a vinylidene chloride resin, polycarbonate, a melamine resin, a urea resin, polyacrylonitrile, polymethyl pentene, a cyclic olefin copolymer, an MBS (methyl methacrylate/butadiene/styrene) resin, an SBC (styrene/butadiene copolymer) resin, polymethacryl styrene, polyester carbonate, polyethylene naphthalate, polyether imide, polyarylate, polyarylsulfone and glass.

According to the screen printing apparatus like this, since without damaging the operability, the humidity can be stabilized, more stable printing can be performed.

Advantageous Effects of Invention

According to the inventive screen printing apparatus and the inventive screen printing method, by controlling the amount of moisture in the paste on the screen printing plate, the printing property of the paste can be improved. According to the inventive electrode formation method of a solar battery, the electrode having a high aspect ratio can be easily formed. Accordingly, by using the electrode formation method of the solar battery like this, the solar battery having high electric characteristics may be prepared.

BRIEF DESCRIPTION OF THE DRAWINGS

FIG. 12 is a diagram showing a relationship between k' and the conversion efficiency Eff (%) in Examples 1 to 12.

DESCRIPTION OF EMBODIMENTS

Figure 1:
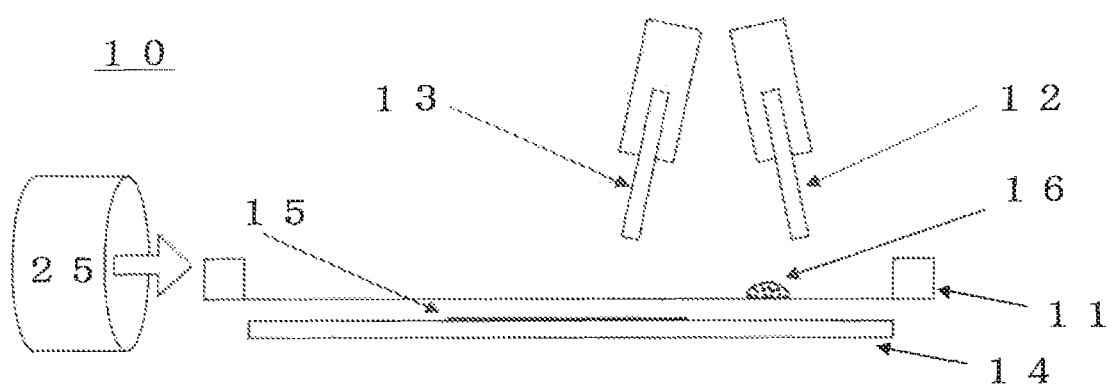
FIG. 1 is a side surface schematic diagram of a main part of an inventive screen printing apparatus.

Hereinafter, the present invention will be more detailed.

According to the conventional screen printing method, there was a problem that since a part of a supplied paste remains stuck out on both sides of a squeegee after a squeegee operation, as the number of times of printing are repeated, while unused paste increases, a solvent component vaporizes from a surface of a stuck-out paste, and when the paste that has become highly viscous is gathered to a center and is used again to print, an amount of the paste discharged from the opening part of the screen printing plate becomes unstable, the paste printed in a pattern-shape on the object to be printed blurs to cause printing failures, and thereby a yield is deteriorated.

The problem like this occurs also when in a production method of a typical crystal silicon solar battery, an electrode is formed by a screen printing method. That is, also in this case, in the same manner as the above, there was a problem that the paste printed in an electrode pattern on a silicon substrate blurs to cause printing failures, and thereby, the yield is deteriorated.

In order to prevent these printing failures from occurring, it has been necessary for an operator to increase a frequency of gathering by scraping the stuck-out paste to the center part or to recover the stuck-out paste and filter a solidified paste component to readjust the viscosity, that is, there were problems of complicated processes and increase of a production cost.

The present inventors conducted intensive study to solve these problems. As a result, the present inventors found that a screen printing apparatus provided with a humidity adjuster for adjusting the humidity in a screen printing apparatus, a screen printing method for adjusting the humidity in the screen printing apparatus when performing screen printing, and an electrode formation method of a solar battery that uses the screen-printing method can solve the above problems, thereby bringing the present invention to completion.

Hereinafter, an embodiment of the present invention will be detailed. However, the present invention can be carried out in broad other embodiments in addition to the following description, and the range of the present invention is not limited to the followings but includes what are described in claims. Further, the drawings are not shown in proportion to original dimensions. In order to make explanation and understanding of the present invention more clear, depending on the related members, a dimension is expanded, further, non-important parts may not be shown in the drawings.

(Screen Printing Apparatus)

Figure 2:
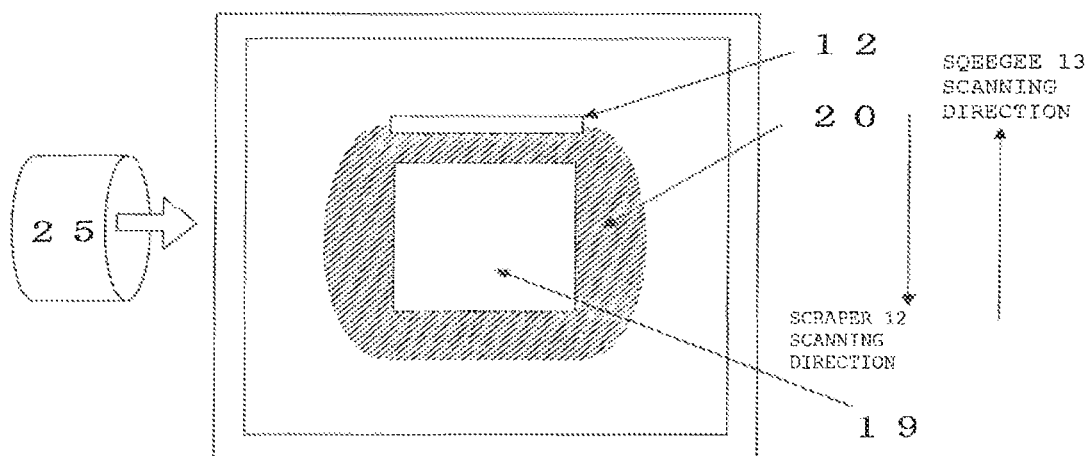
FIG. 2 is a diagram showing a situation of humidifying a stuck-out paste in a screen printing operation that uses the inventive screen printing apparatus.
Figure 2:
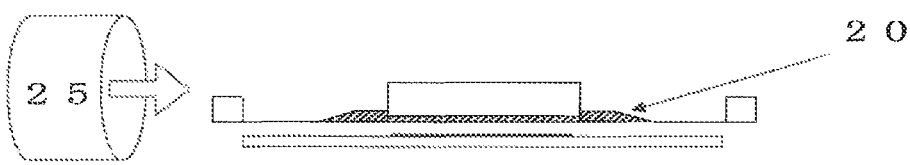

FIG. 1 is a side surface schematic diagram of a main part of an inventive screen printing apparatus. FIG. 2 is a diagram showing a situation of humidifying a stuck-out paste in screen printing that uses the inventive screen printing apparatus ((a) shows a top diagram, and (b) shows a side surface diagram). As shown in FIG. 1 and FIG. 2, an inventive screen printing apparatus 10 includes a screen printing plate 11 on which an opening part corresponding to a printing pattern is provided; a scraper 12 for filling a paste 16 supplied on an upper surface of the screen printing plate 11 into an opening part of the screen printing plate 11; a squeegee 13 for pushing out the paste 16 from the opening part of the screen printing plate 11 to a predetermined position of an object to be printed 15; and a humidity adjuster 25 for adjusting the humidity in the screen printing apparatus 10. Further, a printing stage 14 is provided to install the object to be printed 15. According to the screen printing apparatus like this, by controlling an amount of moisture in the paste on the screen printing plate, the printing property of the paste can be improved.

Further, it is desirable that a space containing at least the screen printing plate 11, the paste 16, the scraper 12, the object to be printed 15, the squeegee 13 and the stage 14 is surrounded by a plate-like member. By thus doing, the humidity during printing can be maintained constant.

Further, the plate-like member is preferably light transmissive. Since the printing step is visually observable from outside, apparatus trouble or defect occurrence may be detected early. Specifically, any one of polyethylene, polypropylene, a vinyl chloride resin, polystyrene, an ABS (acrylonitrile/butadiene/styrene) resin, polyethylene terephthalate, a methacrylic resin, polyvinyl alcohol, a vinylidene chloride resin, polycarbonate, a melamine resin, a urea resin, polyacrylonitrile, polymethyl pentene, a cyclic olefin copolymer, an MBS (methyl methacrylate/butadiene/styrene) resin, an SBC (styrene/butadiene copolymer) resin, polymethacryl styrene, polyester carbonate, polyethylene naphthalate, polyether imide, polyarylate, polyarylsulfone and glass is preferable.

Shapes or the like of the screen printing plate 11, the scraper 12, the squeegee 13, the printing stage 14 and the object to be printed 15 are not particularly limited but can be formed into the same ones as those in the well-known screen printing apparatus.

The humidity adjuster 25 is not particularly limited but, for example, a humidifier, a dehumidifier, an accurate air conditioner (an air conditioner capable of controlling a temperature and humidity) or the like can be used. The humidity adjuster 25 can be provided inside of the screen printing apparatus.

A kind of the paste 16 is not particularly limited but, can contain, for example, a solvent, particles such as conductive particles and other additives. In this case, the kind of the solvent is not particularly limited, but, organic solvents such as an aliphatic hydrocarbon-based solvent, a carbitol-based solvent, a cellosolve-based solvent, a higher fatty acid ester-based solvent, a higher alcohol-based solvent, a higher fatty acid-based solvent and an aromatic hydrocarbon-based solvent may be used.

Examples of the aliphatic hydrocarbon-based solvents include "IP Solvent" produced by Idemitsu Kosan Co., Ltd., "Shellsol D40" (Shellsol is a registered trade mark), "Shellsol D70" "Shellsol 70", and "Shellsol 71" produced by Shell Chemicals, "Isopar G", "Isopar H", "Isopar L", "Isopar M", "Exxol D40", "Exxol D80", "Exxol D100", and "Exxol D130" (boiling point: 279 to 316° C.), "Exxol D149" (boiling point: 280 to 320° C.), and "Exxol DCS100/140" produced by Exxon Corporation.

Further, examples of the carbitol-based solvents include methyl carbitol, ethyl carbitol and butyl carbitol.

Examples of the cellosolve-based solvents include ethyl cellosolve, isoamyl cellosolve, and hexyl cellosolve.

Further, examples of the higher fatty acid ester-based solvents include dioctyl phthalate, isobutyl dibutyl succinate, isobutyl adipate, dibutyl sebacate, and di(2-ethylhexyl) sebacate.

Examples of the higher alcohol-based solvents include methyl hexanol, oleyl alcohol, trimethyl hexanol, trimethyl butanol, tetramethyl nonanol, 2-pentyl nonanol, 2-nonyl nonanol, and 2-hexyl decanol.

Examples of the higher fatty acid-based solvents include capric acid, 2-ethyl hexanoic acid, and oleic acid.

Examples of the aromatic hydrocarbon-based solvents include butyl benzene, diethyl benzene, dipentyl benzene, and diisopropyl naphthalene.

These solvents can be used alone or in a combination of two or more kinds.

Since the inventive screen printing apparatus is provided with the humidity adjuster for adjusting the humidity in the apparatus, the solvent is suppressed from vaporizing and the paste stuck out from a printing pattern region 19 on the plate, in particular, from a squeegee scanning region and a scraper scanning region is suppressed from drying, and thereby a paste surface can be prevented from partially coagulating. Accordingly, even when an operator gathers the stuck out paste to a center part and reuses to print, partial increase of the viscosity of the paste on the plate is nor caused, the printed paste becomes difficult to generate the thickening or rubbing. It is to be noted that, in FIG. 2, a paste deposition region 20 outside of the printing pattern region during continuous printing is schematically shown.

Here, a relationship between the humidity and the vaporization of a solvent will be described. Though the reason why the solvent is suppressed from vaporizing when the humidity in the apparatus is adjusted is not completely clarified, it is considered that the following mechanism may work. When the Henry's law is applied to a solvent having a boiling point higher than water in the paste, it is considered that water of an amount proportional to a partial pressure of water in the surrounding dissolves in the solvent (paste). In response to an amount of dissolved water, the paste viscosity varies, that is, under high humidity, the paste becomes soft, as a result, the frequency of the blur and the disconnection decreases, and the frequency of sagging due to a viscosity decrease decreases, a line having a constant width can be printed. Therefore, when the electrodes of the solar battery are formed according to the present invention, since solar batteries having low performance can be suppressed from occurring, an average of the conversion efficiencies can be improved. It is to be noted that, as was described above, though the reason why the solvent is suppressed from vaporizing is not completely clarified, anyway it is clear that there is a relationship between the humidity and the vaporization of the solvent, and the present invention can be executed irrespective of the kind of the solvent. As described above, it is considered to be important to control, rather than the relative humidity, an absolute humidity or a dew point temperature.

The paste 16 can be formed into a conductive silver paste containing silver particles, glass frit and a varnish when forming, in particular, an electrode for solar batteries. In this case, an object to be printed 15 can be set to a semiconductor substrate.

(Screen Printing Method)

Next, with reference to FIG. 1 and FIG. 2, an inventive screen printing method will be described.

An inventive screen printing method is a screen printing method in which by using the screen printing apparatus 10 provided with the screen printing plate 11 provided with an opening part corresponding to a printing pattern, the scraper 12, and the squeegee 13, after the paste 16 supplied on an upper surface of the screen printing plate 11 is filled into an opening part of the screen printing plate 11 by the scraper 12, the paste 16 is pushed out to a predetermined position of the object to be printed 15 from the opening part of the screen printing plate 11 by the squeegee 13, and the paste 16 is screen-printed on the object to be printed 15 corresponding to the printing pattern, and when performing screen printing, the humidity in the screen printing apparatus 10 is adjusted. According to the screen printing method like this, the printing property of the paste can be improved by controlling an amount of moisture in the paste on the screen printing plate. In particular, when performing the screen printing, it is preferable to set the dew point temperature in the screen printing apparatus 10 to 8.2 to 18.0° C. by adjusting the humidity in the screen printing apparatus 10. Thus, the printing property of the paste may be further improved.

The humidity in the screen printing apparatus 10 is not particularly limited, but is preferably 30% or more and 65% or less by the relative humidity, and more preferably 45% or more and 55% or less by the relative humidity. According to the screen printing method like this, an aspect ratio of the printed paste may be enhanced. Further, depending on also the kind of the solvent used in the paste, a preferable humidity range can be appropriately set.

As a method of adjusting the humidity in the screen printing apparatus 10, as described above, a method of providing the humidity adjuster to the screen printing apparatus to adjust the humidity can be used. More specifically, a method in which by a method of surrounding with, for example, a plate-like member, a printing chamber for housing the screen printing plate 11, the scraper 12, the squeegee 13 or the like is provided, and an accurate air conditioner capable of sending air of which temperature and humidity are adjusted into the printing chamber such that the inside of the printing chamber is positive pressure is installed outside the printing chamber can be used. In this case, the printing chamber need not be completely sealed.

Though the temperature in the screen printing apparatus 10 is not particularly limited but it can be set to, for example, 20° C. or more and 30° C. or less. As a result of intensive studies by the present inventors, it was found that when the temperature in the printing apparatus of the screen printing apparatus is expressed with T (° C.), and the relative humidity in the printing apparatus is expressed with H (%), k defined by the following formula is equal to a dew point temperature (° C.)

$$k = \frac{35.6HT - 179(69-T)(1-H/100)}{35.6H + 49(69-T)(1-H/100)}, \quad \text{(Formula 3)}$$

and when it is set to be 8.2<k<18.0, the printing is stabilized.
Derivation of k (=dew point temperature)
k expressed by the following formula (1)

(Formula 4)

$$k = \frac{35.6HT - 179(69-T)(1-H/100)}{35.6H + 49(69-T)(1-H/100)} \quad (1)$$

was derived as shown below.

First, when a saturated vapor pressure Pr (hPa) of water for a temperature Tr (° C.) is approximated with a hyperbolic function, in 15<Tr<40° C., (Formula 5)

$$Pr = -49 - \frac{3560}{Tr - 69} \quad (2)$$

is obtained. When the formula (2) is transformed, the following formula (3)

(Formula 6)

$$Tr = 69 - \frac{3560}{Pr + 49} \quad (3)$$

is obtained. That is, this is the dew point temperature when the partial pressure of water is Pr. The relative humidity H (%) at the temperature T is expressed by the following formula (4) with the partial pressure P. Further, when the following formula (4) is transformed, the following formula (5) is obtained.

(Formula 7)

$$H = \frac{P}{Pr(T)} \times 100 \quad (4)$$

(Formula 8)

$$\therefore P = \frac{HPr(T)}{100} \quad (5)$$

The dew point temperature at this time is obtained by substituting the above formula (5) in the Pr of the above formula (3).

(Formula 9)

$$Tr = 69 - \frac{3560}{\frac{HPr(T)}{100} + 49} = 69 - \frac{3560}{\frac{H}{100}\left(-49 - \frac{3560}{T-69}\right) + 49} = \quad (6)$$

$$\frac{69\left\{49\left(1 - \frac{H}{100}\right)(T-69) - 35.6H\right\} - 3560(T-69)}{49\left(1 - \frac{H}{100}\right)(T-69) - 35.6H} =$$

$$\frac{69 \times 49\left(1 - \frac{H}{100}\right)(T-69) + (T-69) \times 35.6H - T \times 35.6H - 3560(T-69)}{49\left(1 - \frac{H}{100}\right)(T-69) - 35.6H} =$$

$$\frac{-179\left(1 - \frac{H}{100}\right)(69-T) + 35.6HT}{49\left(1 - \frac{H}{100}\right)(69-T) + 35.6H}$$

Accordingly, the dew point temperature at the temperature T and the relative humidity H is given by a right side member of the above formula (1).

A shape of the opening part of the screen printing plate 11 is not particularly limited but an effect of the present invention is particularly efficiently exhibited to thin-line printing of a length of from 156 to 8 mm. Further, a width of the opening part of the screen printing plate 11 is not particularly limited but can be set to, for example, not more than 60 μm. A lower limit of the width of the opening part of the screen printing plate 11 is not particularly limited but can be set to, for example, 20 μm. According to the inventive screen printing method, even when the opening part of the screen printing plate having a small width like this is used, the printing failure is difficult to occur. As the result of the intensive study of the present inventors, it was found that when the temperature in the printing apparatus of the screen printing apparatus is expressed with T (°), the relative humidity in the printing apparatus is expressed with H (%), and the width of the object to be printed is expressed with w (μm), k' defined by the following formula is equal to the dew point temperature (° C.), $$k' = \frac{6.27}{1.0266^w}\left(\frac{35.6HT - 179(69-T)(1-H/100)}{35.6H + 49(69-T)(1-H/100)} - 14.2\right) + 14.2 \quad \text{(Formula 10)}$$

and, when set such that 8.2<k'<18.0, the printing is stabilized.

Meaning of line width dependence term of k'
k' shown by the following formula (7)

(Formula 11)

$$k' = \frac{6.27}{1.0266^w}\left(\frac{35.6HT - 179(69 - T)(1 - H/100)}{35.6H + 49(69 - T)(1 - H/100)} - 14.2\right) + 14.2 \quad (7)$$

is originally shown by the following formula (8)

(Formula 12)

$$k' = 1.3^{(\frac{70-w}{10})}\left(\frac{35.6HT - 179(69 - T)(1 - H/100)}{35.6H + 49(69 - T)(1 - H/100)} - 14.2\right) + 14.2, \quad (8)$$

and is obtained by substituting approximate values shown by the following formulas (9) and (10) into the above formula (8)

(Formula 13)

$$1.3^7 \cong 6.27 \quad (9)$$

(Formula 14)

$$\sqrt[10]{1.3} \cong 1.0266 \quad (10)$$

(Solar Battery)

Next, one example of a solar battery capable of forming an electrode according to the inventive electrode formation method of a solar battery that uses the screen printing method will be described.

Figure 7:
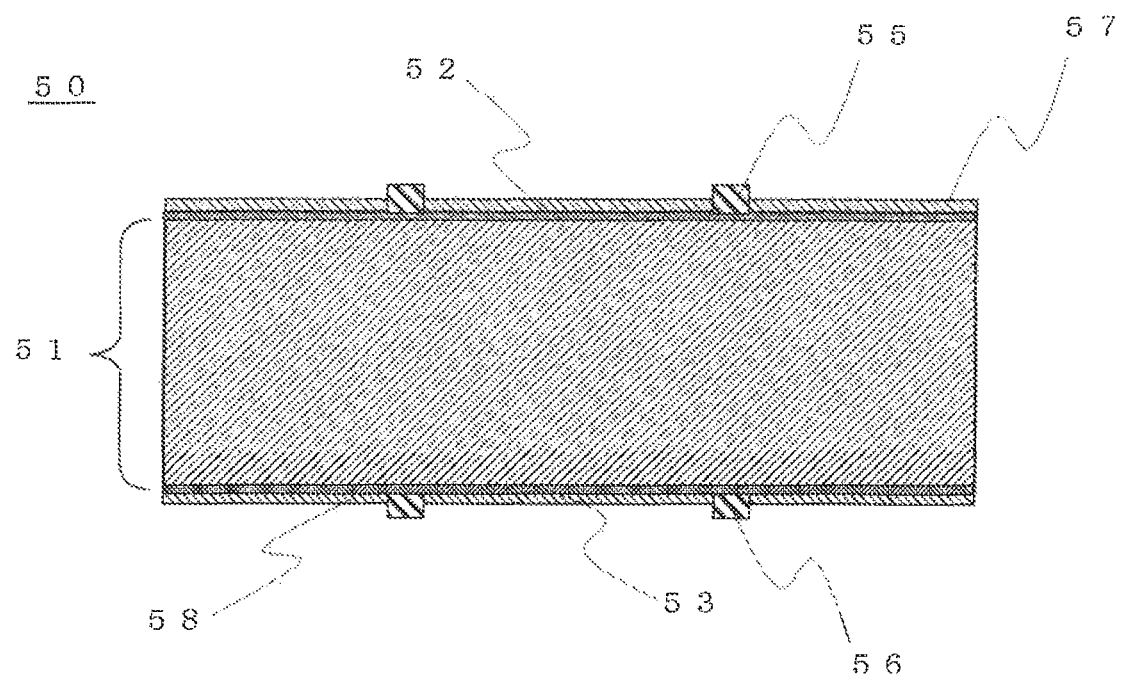
FIG. 7 is a cross-sectional schematic diagram showing one example of a general solar battery.
Figure 8:
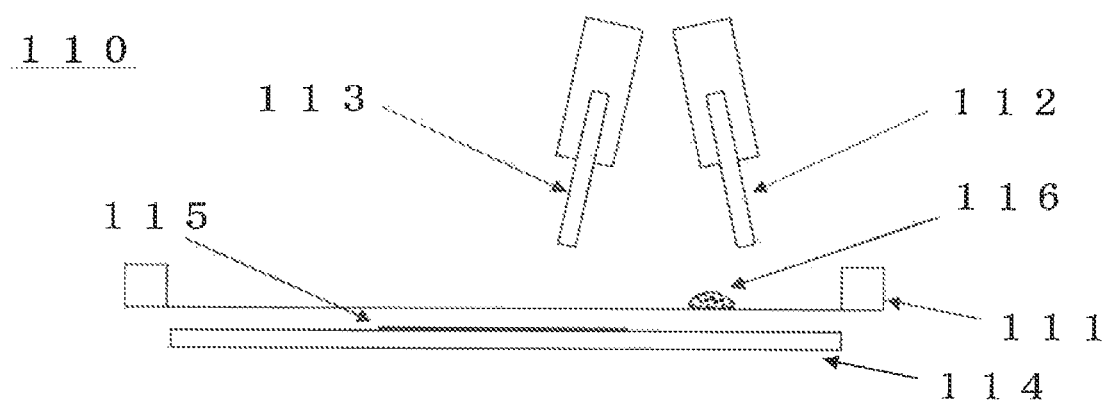
FIG. 8 is a side surface schematic diagram of a main part of the general screen printing apparatus.
Figure 9:
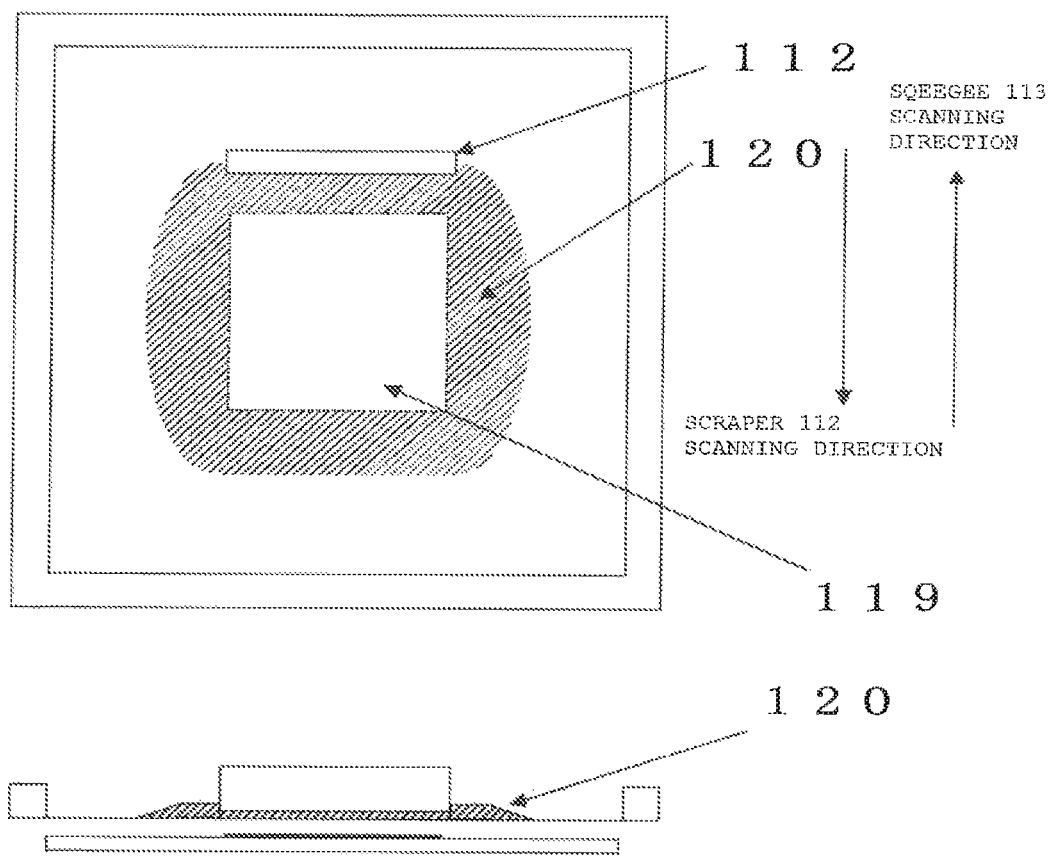
FIG. 9 shows a plan schematic diagram when a breadth of a paste by a general screen printing method is seen from upper side of a screen printing plate and a side surface schematic diagram when a breadth of a paste by a general screen printing method is seen from a lateral side of a screen printing plate.

As described above, FIG. 7 is a cross-sectional schematic diagram of a general solar battery in which an n-type silicon substrate is used as a substrate. As shown in FIG. 7, a solar battery 50 is provided with a light-receiving surface diffusion layer (p type diffusion layer) 52 on a light-receiving surface side and a back surface diffusion layer (n-type diffusion layer) 53 on a back surface side to a semiconductor substrate (n-type silicon substrate) 51. The n-type diffusion layer 53 may be called also as a BSF (back surface field) layer. On the p-type diffusion layer 52, a light-receiving surface electrode 55 is provided, and on the n-type diffusion layer 53, a back surface electrode 56 is provided. Further, on the light-receiving surface side, an antireflection film 57 such as silicon nitride (SiN) or the like is provided. The antireflection film 57 can also work as a passivation film 58. Further, also on the back surface side, a passivation film 58 such as SiN or the like can be provided.

(Production Method of Solar Battery)

Next, a production method of a solar battery will be described, and an inventive electrode formation method of a solar battery will be described. The inventive electrode formation method can be applied to various solar batteries. A solar battery to which the inventive electrode formation method can be applied is not limited to one illustrated in FIG. 7. The inventive electrode formation method can be applied also to production processes other than a production process of the solar battery described below.

Here, a production process of the solar battery shown in FIG. 7 will be described. First, a semiconductor substrate 51 is prepared. As the semiconductor substrate 51, a p-type silicon substrate that is made of single crystal or polycrystalline silicon, may be any of a p-type and an n-type, contains a p-type semiconductor impurity such as boron or the like, and has the specific resistance of from 0.1 to 4.0 $\Omega \cdot cm$ is frequently used. As the semiconductor substrate, a planar one having a magnitude of 100 to 156 mm square and a thickness of from 0.05 to 0.30 mm is preferably used. Hereinafter, a production method of a solar battery that uses an n-type silicon substrate will be described as an example.

After preparation of the n-type silicon substrate 51, on a surface of the n-type silicon substrate 51 that becomes a light-receiving surface of the solar battery, an uneven structure called as a texture is formed in such a manner that a surface damage due to slice or the like is removed by soaking in, for example, an acidic solution, followed by chemical etching with an alkali solution, further followed by cleaning and by drying. The uneven structure generates multiple reflection of light on the light receiving surface of the solar battery. Therefore, by forming the uneven structure, the reflection rate substantially decreases and the conversion efficiency is improved.

Thereafter, by a vapor-phase diffusion method in which the n-type silicon substrate 51 is set in a high temperature gas of from 850 to 1000° C. containing, for example, $BBr_3$ or the like, and the p-type impurity such as boron or the like is diffused over an entire surface of the n-type silicon substrate 51, a p-type diffusion layer 52 having sheet resistance of about 30 to 300$\Omega/\square$ is formed on the light-receiving surface. It is to be noted that, when forming the p-type diffusion layer by the vapor-phase diffusion method, the p-type diffusion layer may be formed not only on the light-receiving surface but also on a back surface and an edge surface of the n-type silicon substrate. In this case, by soaking the p-type silicon substrate in which a light-receiving surface on which the p-type diffusion layer is necessary to be left is covered with an acid-resistant resin in a fluoronitric acid solution, an unnecessary p-type diffusion layer formed on the back surface and the edge surface can be removed. Thereafter, by soaking in a chemical, for example, such as a diluted hydrofluoric acid solution, a glass layer formed on a surface of the n-type silicon substrate during diffusion is removed, followed by cleaning with pure water.

Thereafter, the n-type silicon substrate 51 is set in an oxygen gas of from 850 to 1000° C., an entire surface of the n-Lype silicon substrate 51 is thermally oxidized to form a thermally oxidized film of about 1000 Å. Then, a light-receiving surface on which the p-type diffusion layer is necessary to be left is covered with the acid resistant resin, followed by soaking the n-type silicon substrate 51 in a hydrofluoric acid solution, thus the thermally oxidized film formed on the back surface can be removed. Here, the thermally oxidized film on the light-receiving surface side works as a barrier film in the n-type impurity diffusion.

Thereafter, the n-type silicon substrate 51 is set in a high temperature gas of from 850 to 1000° C. containing, for example, $POCl_3$ or the like, by a vapor-phase diffusion method in which the n-type impurity such as phosphorus or the like is diffused on a back surface of the n-type silicon substrate 51, an n-type diffusion layer 53 having the sheet resistance of about 30 to 300 $\Omega/\square$ is formed. Thereafter, by soaking in a chemical, for example, such as a diluted hydrofluoric acid solution, a glass layer formed on a surface of the n-type silicon substrate during diffusion is removed, followed by cleaning with pure water.

It is to be noted that the method of forming the n-type diffusion layer 53 and the p-type diffusion layer 52 are not limited to the above vapor-phase diffusion method. A method in which a coating agent containing an n-type or a p-type impurity is coated on the substrate, followed by thermally treating (coating diffusion method) can be used.

Next, a substrate side surface is subjected to junction isolation by plasma etching. The junction isolation due to the plasma etching can be applied before removal of the glass layer formed on a surface of the silicon substrate during diffusion of the p-type impurity element or can be applied after the removal.

Further, an antireflection film and passivation film 57 is formed on the light-receiving surface side of the n-type silicon substrate 51 and a passivation film 58 is formed on the back surface side. These films are made of, for example, SiN or the like, and formed by a plasma CVD method in which a mixed gas of, for example, $SiH_4$ and $NH_3$ is diluted with $N_2$, and plasma is generated by a glow discharge decomposition to deposit a film. The antireflection film and passivation film 57 is formed, by considering a difference of the refractive index with the n-type silicon substrate or the like, such that the refractive index is about from 1.8 to 2.3, and a thickness thereof is formed to a thickness of about from 500 to 1000 Å, light is prevented from being reflected at the surface of the n-type silicon substrate and the light is effectively incorporated in the n-type silicon substrate. Further, the SiN works also as a passivation film having a passivation effect to the p-type diffusion layer and has an effect of improving the electric characteristics of the solar battery in addition to an antireflection function.

Next, an electrode is formed using the inventive electrode formation method of a solar battery. The inventive electrode formation method of a solar battery is a method in which by using the inventive screen printing method, on an at least one main surface of the semiconductor substrate 51, the paste 16 is screen-printed, and the screen-printed paste 16 is dried and fired to form an electrode. According to the electrode formation method of the solar battery like this, by adjusting the humidity in the screen printing apparatus, the paste on the screen printing plate is prevented from drying and a paste discharge is stabilized, and an electrode having high aspect ratio may be easily formed. Accordingly, when the electrode formation method of the solar battery like this is used, solar batteries having high electric characteristics and high conversion efficiency can be prepared at a high yield.

The paste 16 can be screen-printed on, for example, a light-receiving surface and a back surface. In this case, an order of the screen-printing is not particularly limited. In this case, the paste on the back surface and the paste on the light-receiving surface can be simultaneously fired or can be separately fired.

Specifically, first, a conductive silver paste containing, for example, silver particles, glass frit and a varnish is screen-printed according to the inventive screen-printing method on the back surface and dried. A printing pattern at this time is not particularly limited but can be formed into thin lines that are substantially parallel and connect both ends of the substrate. That is, though depending on the substrate size, a parallel line pattern having a length of from 156 to 100 mm can be formed. Although a width of the printing pattern is not limited particularly, when setting to not larger than 60 μm, an effect of the present invention is particularly preferably exhibited. Thereafter, the conductive silver paste is screen-printed on the light-receiving surface using the inventive screen printing method and dried. A printing pattern of the light-receiving surface can be also appropriately set in the same manner as in the back surface. Thereafter, the pastes for the respective electrodes are fired at a temperature from about 500° C. to 950° C. to form a light-receiving surface electrode 55 and a back surface electrode 56. At this time, even when a film of the SiN or the like has been formed on a surface of the silicon substrate as described above, an electrode may be formed by making penetrating through the film during firing (fire through).

Although a kind of the electrode to be formed is not particularly limited, the electrode to be formed can be formed into a finger electrode and the aspect ratio of the finger electrode can be set to 0.5 or more and 1.0 or less. According to the inventive electrode formation method of the solar battery, since the thickening or rubbing of the printed paste are difficult to occur, a finger electrode having a high aspect ratio like this may be easily formed. It is to be noted that, according to the present invention, it is also possible that a paste for forming the finger electrode and a paste for forming the bus bar electrode are simultaneously printed on at least one main surface of the semiconductor substrate to form the finger electrode and the bus bar electrode. In the case of the simultaneous formation of the finger electrode and the bas bar electrode, depending on the number of the bas bar electrodes, length of the finger electrode varies. Although the number of the bas bar electrodes of about from 2 to 12 is suitable and length of the finger electrode becomes from 76 mm to 8 mm, even in case of such a length, an effect of the present invention can be exhibited.

EXAMPLES

Hereinafter, the present invention will be more detailed with reference to Examples and Comparative Examples. However, the present invention is not limited to the following examples.

Example 1

A phosphorus-doped n-type single crystal silicon substrate of 15.6 cm squares and 200 μm thick having crystal plane orientation (100) and an as-sliced resistivity of 2 Ω·cm (a dopant concentration: $7.2 \times 10^{15}$ $cm^{-3}$) was soaked in a sodium hydroxide aqueous solution to remove a damaged layer by etching, followed by alkali etching by soaking in an aqueous solution obtained by adding isopropyl alcohol to a potassium hydroxide aqueous solution to form a texture. A whole of the obtained substrate was heat treated at 1000° C. for 1 hour to form an oxide film. Then, the oxide film of the light-receiving surface was removed by a chemical liquid such as hydrofluoric acid, and after a coating agent containing a boron dopant was coated on the light-receiving surface, a heat treatment was applied at 950° C. for 1 hour to form a p-type diffusion layer on the light-receiving surface. After the heat-treatment, a glass component attached to the substrate was removed by a hydrofluoric acid solution or the like, followed by cleaning.

Again, a silicon oxide film was formed on the whole of the silicon substrate, the silicon oxide film on the back surface was removed by using a chemical liquid such as hydrofluoric acid, the coating agent containing a phosphorus dopant was coated on the back surface, followed by heat-treating at 900° C. for 30 minutes, thus an n-type diffusion layer was formed on a whole back surface.

Then, the junction isolation was applied to a side surface of the substrate by plasma etching. Specifically, the substrates in which the diffusion heat treatment was performed and a diffusion layer was formed on both surfaces were stacked such that plasma or radicals do not intrude into the light-receiving surface or the back surface, the plasma etching treatment using a $CF_4$ gas was applied, and edge surfaces of the substrates were scraped by several micrometers.

Next, a glass component attached to the substrate was removed by a high concentration hydrofluoric acid solution or the like, followed by cleaning.

Subsequently, by using a direct plasma CVD apparatus, a silicon nitride film that is a surface protective film was deposited on the light-receiving surface and the back surface. A film thickness was 100 nm.

At the end, the humidity in the printing apparatus was adjusted to 45% RH by a humidifier under a constant temperature of 25° C., to each of the light-receiving surface side and the back surface side, a silver paste (SOL 9350A SOLAR CELL PASTE produced by Heraeus Group (this contains silver particles, 2-(2-buthoxyethoxy)ethanol and other additives)) was printed in an electrode pattern, and a silver paste having a finger electrode pattern shape and a bas bar electrode pattern shape was formed. A finger opening width was set to 60 μm. The silver paste was, after drying, fired at 800° C. for 20 minutes to form a light-receiving surface electrode and a back surface electrode. During printing, an operation of scraping the paste on a plate emulsion stuck out of the finger electrode pattern region to a center portion was performed at a frequency of once for every 500 printings.

Example 2

A solar battery was prepared in the same process as in Example 1 except that the humidity in the printing apparatus was adjusted to 50% RH.

Example 3

A solar battery was prepared in the same process as in Example 1 except that the humidity in the printing apparatus was adjusted to 54% RH.

Example 4

A solar battery was prepared in the same process as in Example 1 except that the humidity in the printing apparatus was adjusted to 14% RH.

Example 5

A solar battery was prepared in the same process as in Example 1 except that the humidity in the printing apparatus was adjusted to 21% RH.

Example 6

A solar battery was prepared in the same process as in Example 1 except that the humidity in the printing apparatus was adjusted to 33% RH.

Example 7

A solar battery was prepared in the same process as in Example 1 except that the humidity in the printing apparatus was adjusted to 63% RH.

Example 8

A solar battery was prepared in the same process as in Example 1 except that the humidity in the printing apparatus was adjusted to 65% RH.

Example 9

A solar battery was prepared in the same process as in Example 1 except that the humidity in the printing apparatus was adjusted to 70% RH.

Figure 3:
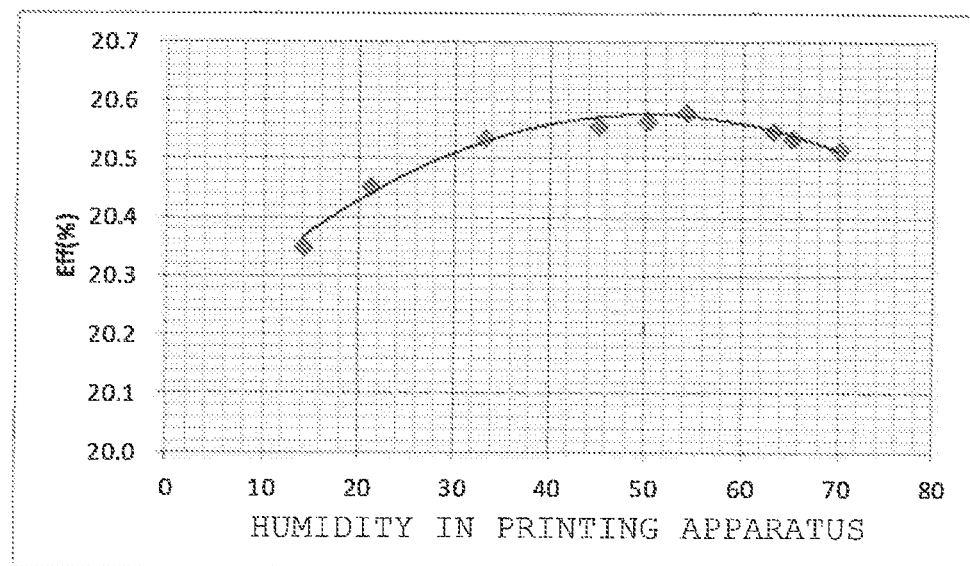
FIG. 3 is a diagram showing a relationship between a relative humidity (% RH) in the printing apparatus and a conversion efficiency Eff (%) in Examples 1 to 9.
Figure 4:
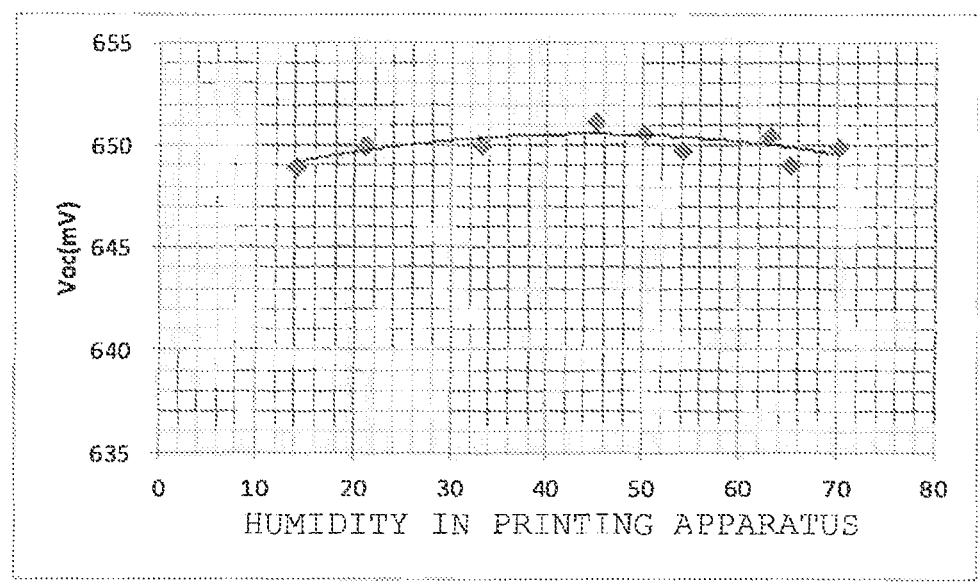
FIG. 4 is a diagram showing a relationship between the relative humidity (% RH) in the printing apparatus and an open-circuit voltage $V_{oc}$(mV) in Examples 1 to 9.
Figure 5:
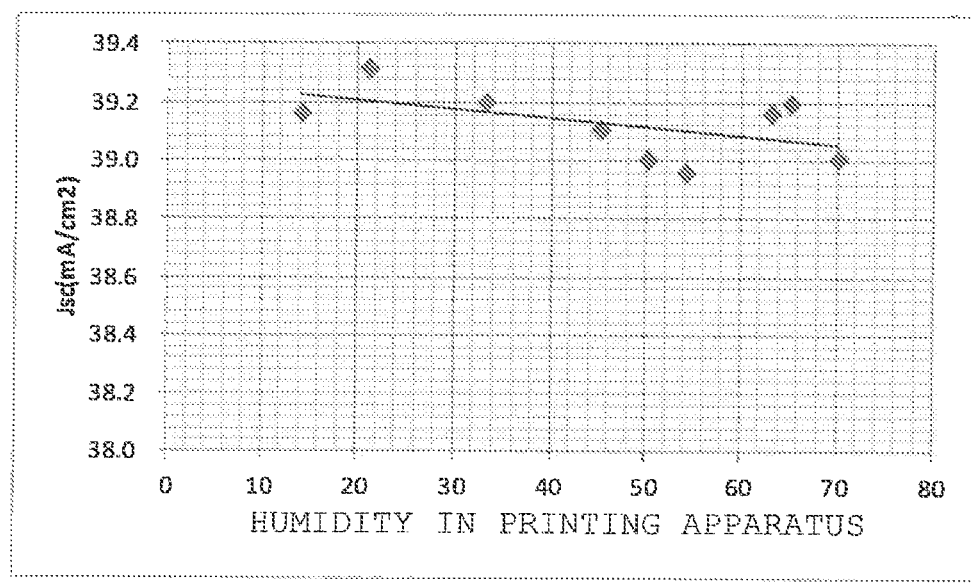
FIG. 5 is a diagram showing a relationship between the relative humidity (% RH) in the printing apparatus and a short-circuit current density $J_{sc}$ (mA/cm$^2$) in Examples 1 to 9.
Figure 6:
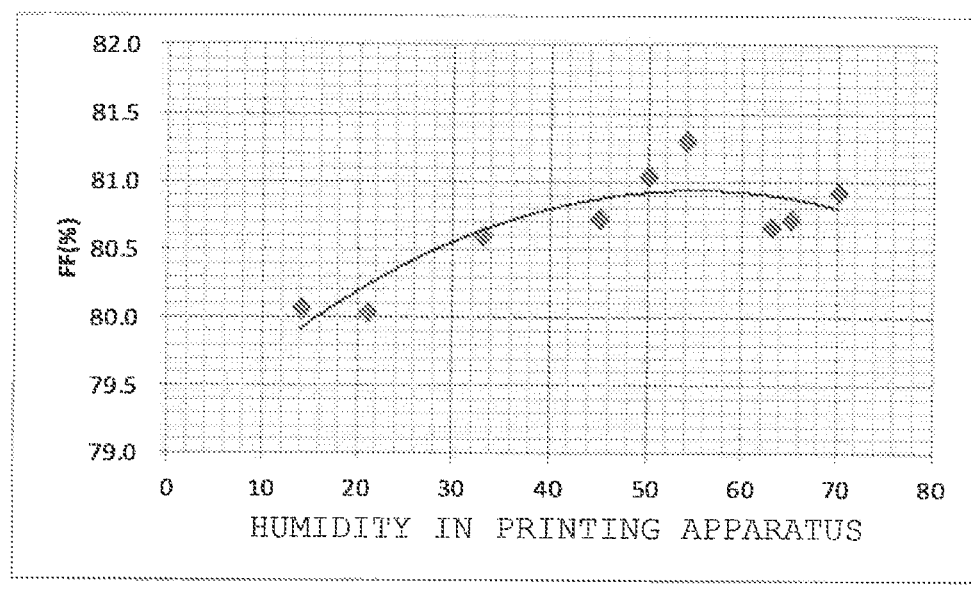
FIG. 6 is a diagram showing a relationship between the relative humidity (% RH) in the printing apparatus and a fill factor (%) in Examples 1 to 9.
Figure 10:
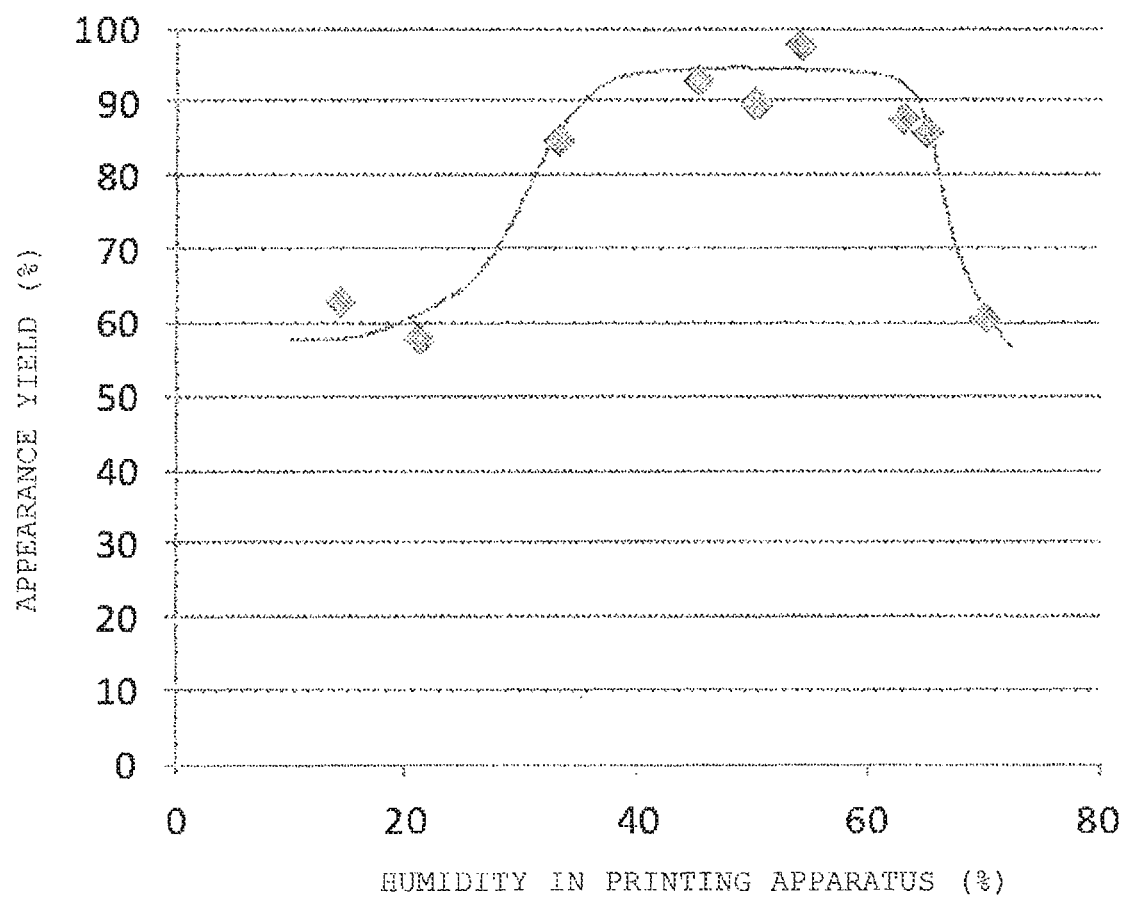
FIG. 10 is a diagram showing a relationship between the relative humidity (% RH) in the printing apparatus and an appearance yield (%) in Examples 1 to 9.

In Table 1 and FIG. 3 to FIG. 6, the conversion efficiencies and average values of the respective characteristic factors for every 5000 sheets of the solar batteries prepared by printing the conductive paste according to the methods of the Examples 1 to 9 are shown. FIG. 3 is a diagram showing a relationship between the relative humidity (% RH) in the printing apparatus and the conversion efficiency Eff (%) in Examples 1 to 9. FIG. 4 is a diagram showing a relationship between the relative humidity (% RH) in the printing apparatus and the open-circuit voltage $V_{oc}$(mV) in Examples 1 to 9. FIG. 5 is a diagram showing a relationship between the relative humidity (% RH) in the printing apparatus and the short-circuit current density $J_{sc}$(mA/cm$^2$) in Examples 1 to 9. FIG. 6 is a diagram showing a relationship between the relative humidity (% RH) in the printing apparatus and the fill factor (%) in Examples 1 to 9. Further, a yield investigation result by the corresponding appearance inspection is shown in FIG. 10. The solar battery in which disconnection or electrode thickening was found was determined as defect.

TABLE 1

| | Humidity in printing apparatus (% RH) | Conversion efficiency Eff (%) | Open-circuit voltage $V_{cc}$ (mV) | Sort-circuit current density $J_{sc}$ (mA/cm$^2$) | Fill factor FF (%) |
|---|---|---|---|---|---|
| Example 1 | 45 | 20.56 | 651.2 | 39.11 | 80.73 |
| Example 2 | 50 | 20.57 | 650.6 | 39.01 | 81.04 |
| Example 3 | 54 | 20.58 | 649.8 | 38.96 | 81.30 |
| Example 4 | 14 | 20.35 | 649.0 | 39.16 | 80.07 |
| Example 5 | 21 | 20.46 | 650.0 | 39.32 | 80.04 |
| Example 6 | 33 | 20.54 | 650.0 | 39.20 | 80.60 |
| Example 7 | 63 | 20.55 | 650.5 | 39.16 | 80.67 |
| Example 8 | 65 | 20.54 | 649.1 | 39.20 | 80.72 |
| Example 9 | 70 | 20.52 | 650.0 | 39.01 | 80.92 |

As shown in Table 1 and FIG. 3 to FIG. 6, by using the inventive screen printing method (Examples 1 to 9), the solar batteries having high conversion efficiency may be prepared. Excellent results were obtained, in, in particular, Examples 1 to 3. This is because a local increase of the paste viscosity due to variation of the moisture amount on a surface of the paste stuck out from the printing region is suppressed, a stable paste discharge amount is obtained. According to the screen printing method like this, the electric characteristics of the solar battery are improved as shown above and also the yield by the appearance inspection tends to increase. On the other hand, as the humidity increases, the $J_{sc}$ tends to decrease. Therefore, it is found that in order not to generate the thickening of the finger width due to a decrease of the paste viscosity, that is, a decrease in the aspect ratio, appropriate humidification (Examples 1 to 3) is more preferable. A high appearance yield was obtained in the humidity of 30% or more and 65% or less. This is because when the humidity is 30% or more, mainly the disconnection became difficult to occur, and when the humidity is 65% or less, mainly the line thickening became difficult to occur. From the viewpoint of the appearance, the humidity is preferable to be from 30% to 65%.

COMPARATIVE EXAMPLES

Solar batteries were prepared in the same process as in Example 1 except that the humidity in the printing apparatus was not adjusted. In Comparative Examples, due to fluctuation of the humidity, a discharge amount of the paste could not be controlled and the printing property of the paste deteriorated. Therefore, under the same conditions (excluding the condition of humidity) as in Example 1, 5000 sheets of the solar batteries could not be prepared.

Example 10

A solar battery was prepared in the same process as in Example 1 except that the temperature was adjusted to 15° C. and the humidity was adjusted to 14 to 90% RH in the printing apparatus.

Example 11

A solar battery was prepared in the same process as in Example 1 except that the temperature was adjusted to 35° C. and the humidity was adjusted to 14 to 54% RH in the printing apparatus.

Example 12

Solar batteries were prepared in the same processes as in Examples 1 to 9 except that a finger opening width was set to 40 Lm.

Figure 11:
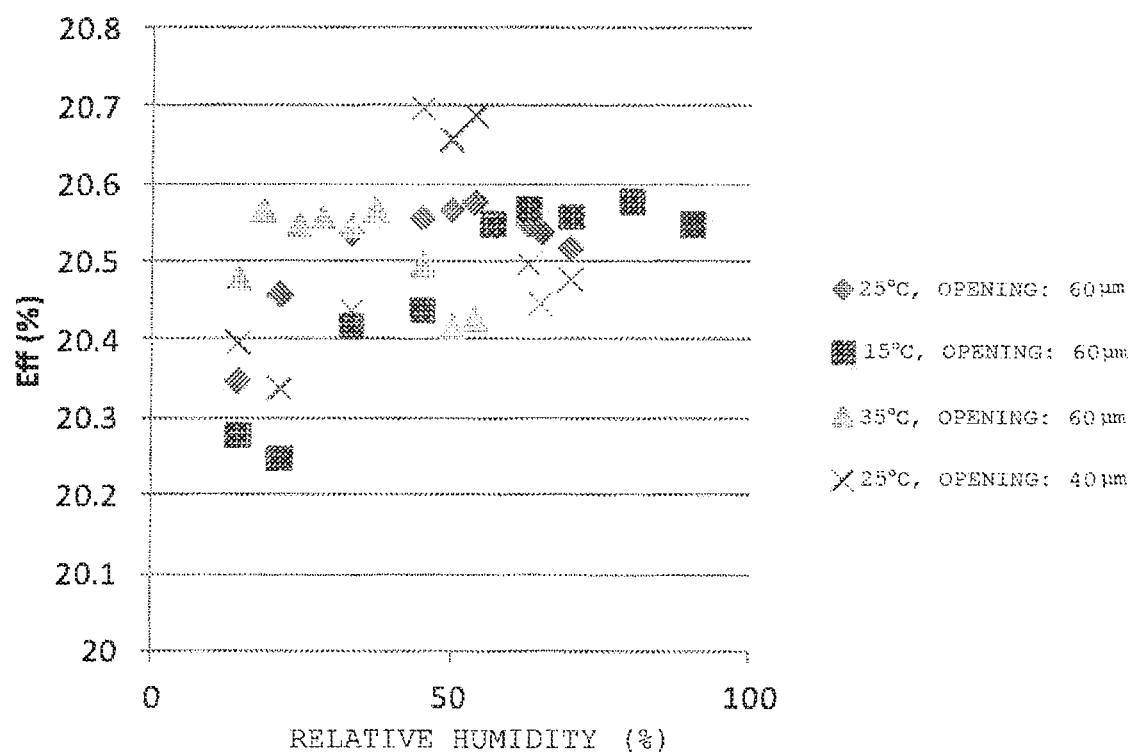
FIG. 11 is a diagram showing a relationship between the relative humidity (% RH) in the printing apparatus and a conversion efficiency Eff (%) in Examples 1 to 12.

Results of Examples 1 to 12 are shown together in FIG. 11. In low temperatures, at high humidities, and in high temperatures, at low humidities, the conversion efficiencies become higher. Further, when the line width is smaller, an optimum range of the humidity becomes narrower.

When the temperature in the printing apparatus is expressed with T (° C.), the relative humidity in the printing apparatus is expressed with H (%), and the width of the printed matter is expressed with w (μm), for k' defined by the following formula $$k' = \frac{6.27}{1.0266^w} \left( \frac{35.6HT - 179(69-T)(1-H/100)}{35.6H + 49(69-T)(1-H/100)} - 14.2 \right) + 14.2, \quad \text{(Formula 15)}$$

the obtained data were substituted and replotted in FIG. 12. In FIG. 11, as the temperature fluctuates, the optimum temperature fluctuates. However, when the parameter k' corresponding to the dew point temperature in the present invention is introduced, the temperature, the humidity and the line width could be integrally normalized. From FIG. 12, the optimum value of the k' may be set to 8.2<k'<18.0.

According to the present invention, it was shown that when the humidity in the screen printing apparatus is adjusted, the discharge amount of the paste during conductive paste printing of the solar battery is stabilized and solar batteries having high conversion efficiency can be prepared.

It is to be noted that the present invention is not limited to the above embodiments. The above embodiments are merely exemplary, and, all of what has the substantially same configuration and exerts same functions and effects as technical idea described in claims of the present invention are included in the technical scope of the present invention.

The invention claimed is:
1. A screen printing method, comprising:
by using a screen printing apparatus provided with a screen printing plate having an opening part corresponding to a printing pattern, a scraper, and a squeegee, filling a paste supplied on an upper surface of the screen printing plate into the opening part of the screen printing plate by the scraper; and
after the filling step, pushing out the paste to a predetermined position of an object to be printed from the opening part of the screen printing plate by the squeegee to screen-print the paste corresponding to the printing pattern on the object to be printed,
wherein a shape of the opening part of the screen printing plate is formed into a thin line shape,
a width of the opening part of the screen printing plate is set to not larger than 60 μm,
a humidity in the screen printing apparatus is adjusted during the screen printing, and
when a temperature in the printing apparatus of the screen printing apparatus is expressed with T(° C.), a relative humidity in the printing apparatus is expressed with H(%), and a width of the printed matter is expressed with w (μm), k' defined by Formula I is set to be 8.2<k'<18.0:

$$k' = \frac{6.27}{1.0266^w} \left( \frac{35.6HT - 179(69-T)(1-H/100)}{35.6H + 49(69-T)(1-H/100)} - 14.2 \right) + 14.2. \quad \text{(I)}$$

2. The screen printing method according to claim 1, wherein when performing the screen printing, by adjusting the humidity in the screen printing apparatus, a dew-point temperature in the screen printing apparatus is set to 8.2 to 18.0° C.

3. The screen printing method according to claim 1, wherein when the temperature in the printing apparatus of the screen printing apparatus is expressed with T (° C.) and the relative humidity in the printing apparatus is expressed with H (%), k defined by Formula II is set to be 8.2<k<18.0:

$$k = \frac{35.6HT - 179(69-T)(1-H/100)}{35.6H + 49(69-T)(1-H/100)}. \quad \text{(II)}$$

4. The screen printing method according to claim 2, wherein when the temperature in the printing apparatus of the screen printing apparatus is expressed with T (° C.) and the relative humidity in the printing apparatus is expressed with H (%), k defined by Formula II is set to be 8.2<k<18.0:

$$k = \frac{35.6HT - 179(69-T)(1-H/100)}{35.6H + 49(69-T)(1-H/100)}. \quad \text{(II)}$$

5. The screen printing method according to claim 1, wherein the humidity in the screen printing apparatus is adjusted between 30 to 65% by the relative humidity.

6. The screen printing method according to claim 2, wherein the humidity in the screen printing apparatus is adjusted between 30 to 65% by the relative humidity.

7. The screen printing method according to claim 3, wherein the humidity in the screen printing apparatus is adjusted between 30 to 65% by the relative humidity.

8. The screen printing method according to claim 4, wherein the humidity in the screen printing apparatus is adjusted between 30 to 65% by the relative humidity.

9. The screen printing method according to claim 1, wherein the humidity in the screen printing apparatus is adjusted within 50±5% by the relative humidity.

10. The screen printing method according to claim 2, wherein the humidity in the screen printing apparatus is adjusted within 50±5% by the relative humidity.

11. The screen printing method according to claim 1, wherein the paste contains one or more kinds of organic solvents selected from an aliphatic hydrocarbon-based solvent, a carbitol-based solvent, a cellosolve-based solvent, a higher fatty acid ester-based solvent, a higher alcohol-based solvent, a higher fatty acid-based solvent and an aromatic hydrocarbon-based solvent.

12. The screen printing method according to claim 2, wherein the paste contains one or more kinds of organic solvents selected from an aliphatic hydrocarbon-based solvent, a carbitol-based solvent, a cellosolve-based solvent, a higher fatty acid ester-based solvent, a higher alcohol-based solvent, a higher fatty acid-based solvent and an aromatic hydrocarbon-based solvent.

13. The screen printing method according to claim 1, wherein a length in the longitudinal direction of the opening part of the screen printing plate is set to 156 to 8 mm.

14. An electrode formation method of a solar battery comprising:
by using the screen printing method according to claim 1, screen-printing the paste on at least one main surface of a semiconductor substrate; and
drying and firing the screen-printed paste to form an electrode.

15. The electrode formation method of a solar battery according to claim 14, wherein the electrode to be formed is formed into a finger electrode, and an aspect ratio of the finger electrode is set to 0.5 or more and 1.0 or less.

\* \* \* \* \*